United States Patent
Saran et al.

(12) 
(10) Patent No.: US 6,448,650 B1
(45) Date of Patent: *Sep. 10, 2002

(54) FINE PITCH SYSTEM AND METHOD FOR REINFORCING BOND PADS IN SEMICONDUCTOR DEVICES

(75) Inventors: Mukul Saran, Richardson; Charles A. Martin, Melissa; Ronald H. Cox, Plano, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/312,385

(22) Filed: May 14, 1999

Related U.S. Application Data

(60) Provisional application No. 60/085,876, filed on May 18, 1998.

(51) Int. Cl.$^7$ .................................................. H01L 23/52
(52) U.S. Cl. ...................... 257/758; 257/750; 257/763; 257/786; 257/773; 257/774; 257/775
(58) Field of Search ................................ 257/758, 750, 257/763, 786, 773, 774, 775

(56) References Cited

U.S. PATENT DOCUMENTS

| | | | | | |
|---|---|---|---|---|---|
| 5,739,587 A | * | 4/1998 | Sato | ............................ | 257/758 |
| 5,986,343 A | * | 11/1999 | Chittipeddi et al. | ......... | 257/758 |
| 6,025,277 A | * | 2/2000 | Chen et al. | .................. | 438/738 |
| 6,091,140 A | * | 7/2000 | Toh et al. | .................... | 257/691 |
| 6,100,589 A | * | 8/2000 | Tanaka | ........................ | 257/758 |
| 6,124,214 A | * | 9/2000 | Hembree et al. | ............. | 438/745 |
| 6,232,238 B1 | * | 5/2001 | Chang et al. | ................ | 438/725 |

* cited by examiner

*Primary Examiner*—David L. Talbott
*Assistant Examiner*—Luan Thai
(74) *Attorney, Agent, or Firm*—Michael K. Skrehot; W. James Brady, III; Frederick J. Telecky, Jr.

(57) ABSTRACT

A reinforcing system and method of fabrication for a semiconductor integrated circuit bond pad comprises a first dielectric layer or stack disposed under the bond pad; at least one second dielectric layer or stack disposed under the first dielectric layer; and a reinforcing metal structure disposed into the second dielectric layer such that the patterns of the metal structure and the second dielectric layer comprise a uniformly flat interface towards the first dielectric layer. The patterns of the metal structure and the second dielectric layer comprise feature sizes and fine pitches used in the integrated circuit.

27 Claims, 2 Drawing Sheets

FINE PITCH SYSTEM AND METHOD FOR REINFORCING BOND PADS IN SEMICONDUCTOR DEVICES

This application claims priority from Provisional application Ser. No. 60/085,876, filed May 18, 1998.

The present invention is related in general to the field of semiconductor devices and processes and more specifically to system and methods of reinforcing bond pads applying the same fine feature size design rules as for integrated circuits.

BACKGROUND OF THE INVENTION

It is well known in semiconductor technology that bond pads on silicon integrated circuits can be damaged during wafer probing using fine-tip tungsten needles, further during conventional thermosonic wire bonding to aluminum metallization on the circuits, or during solder ball attachment in more recent technical developments. Mechanical loading and ultrasonic stresses applied by the tip of the bonding capillary to the bond pad are particularly suspect. When the damage is not apparent during the bonding process, the defects may manifest themselves subsequently by succumbing to thermo-mechanical stresses generated during plastic encapsulation, accelerated reliability testing, temperature cycling, and device operation. The damage appears in most cases as microcracks which may progress to fatal fractures in the underlying dielectric, as chip-outs of brittle or mechanically weak dielectric films, often together with pieces of metal or silicon, or as lifted ball bonds or delamination of metal layers.

Recent technological developments in the semiconductor industry tend to aggravate the problem. For instance, newer dielectric materials such as silicon-containing hydrogen silsesquioxane (HSQ) are being preferred due to their lower dielectric constant which helps to reduce the capacitance C in the RC time constant and thus allows higher circuit speed. Since the density and porosity of dielectric films affect the dielectric constant through absorption or desorption of water, films with these characteristics are introduced even when they are mechanically weaker. Films made of aerogels, organic polyimides, and parylenes fall into the same category. These materials are less dense and mechanically weaker than previous standard insulators such as the plasma-enhanced chemical vapor deposited dielectrics. This trend even affects stacks of dielectric layers such as alternating layers of plasma-generated tetraethylorthosilicate (TEOS) oxide and HSQ, or ozone TEOS oxide and HSQ. Since these material are also used under the bond pad metal, they magnify the risk of device failure by cracking.

In addition, the pitch of bond pads is being progressively more reduced to save valuable silicon real estate. Consequently, the bonding parameters have to become more aggressive to achieve stronger bonds in spite of smaller size. Bonding force and ultrasonic energy during bonding are being increased. Again, the risk of yield loss and lowered reliability is enhanced.

For conventional bond pad metallization processes, a solution to the aforementioned problems was disclosed in patent application Ser. No. 08/847,239, filed May 1, 1997, titled "System and Method for Reinforcing a Band Pad", assigned to Texas Instruments Incorporated. Some concepts and methods of this disclosure have been subsequently described in a publication entitled "Elimination of Bond-pad Damage through Structural Reinforcement of Intermetal Dielectrics" by M. Saran et al. (Internat. Reliab. Physics Symp., March 1998). In essence, a mechanically strong metal structure is serving as reinforcement for the mechanically weak dielectric layer. The metal is deposited and then etched to form "reservoirs" to be filled with the dielectric material, for example HSQ. For instance, the metal pattern thus formed may include grid-shaped or crucifix-shaped elements. The metal line widths and spacing are structured to confine much of the HSQ into the reservoirs while minimizing the area of each reservoir so that the HSQ layer is spared the direct mechanical impact of the bonding process.

Since HSQ is deposited by a spin-on process, the sizes of the reservoirs have to remain large enough to be filled controllably with the dielectric. This requirement is contrary to the industry trend for continued shrinking of all circuit feature sizes. Furthermore, the industry-wide trend towards smaller dimensions for increasing circuit speed brought the so-called damascene metallization process recently to wide acceptance. In this process flow, an insulator film is formed first; openings such as trenches are then etched into this film. Next, metal such as copper or aluminum is deposited to fill these openings. Whatever metal is deposited elsewhere on the surface, is removed by grinding and polishing, leaving only the metal embedded in the trenches. This process flow, however, is the inverse of the conventional process underlying the above cited patent application.

Wire bonding and solder ball flip-chip bonding over damascene metal pads are facing the same issues (transfer of mechanical and ultrasonic energies to the bond pads and risks of cracking weak dielectric layers) as in the case of conventional metallization. In addition, dielectric materials, even gels or foams, with lower dielectric constants are continually introduced in spite of their lowered mechanical strengths. This trend is driven not only circuit speed, but also by power dissipation and cross-talk, for instance in hand-held communication terminals.

An urgent need has, therefore, arisen for a reliable system and method for fine-pitch reinforcement of bond pads using the damascene metallization process. The system and method should provide stress-free, simple and low-cost bond pads suitable for flexible, tolerant bonding processes even when the bond pads are situated above one or more structurally and mechanically weak dielectric layers. The system and method should be applicable to a wide spectrum of design, material and process variations, leading to improved process yield and device reliability. Preferably, these innovations should be accomplished using the installed process and equipment base so that no investment in new manufacturing machines is needed.

SUMMARY OF THE INVENTION

In accordance with the present invention, a bond pad reinforcing system and method are provided which are compatible with the damascene metallization process and permit fine-pitch designs of the reinforcing system comparable to the feature sizes of the integrated circuit components. The system eliminates or substantially reduces the disadvantages associated with prior apparatus and methods.

The invention utilizes the sequence of processing steps applied to producing the integrated circuit. For the reinforcing structure, the dielectric layers are deposited first and the trenches etch with design rules typical for integrated circuit features. These fine-pitch openings are filled with metal such that metal and dielectrics are discretely confined to their respective regions.

It is an object of the invention to advance the process and operation reliability of semiconductor wire bonded and solder attached assemblies by structurally reinforcing the bond pad metallizations even for multi-level architectures under the bond pads.

Another object of the invention is to eliminate restrictions on the size of the dielectric pattern, thus minimizing the risks of inflicting cracking damage even to very brittle dielectrics.

Another object of the invention is to provide design concepts and process methods which are flexible so that they can be applied to several families of products, and are general, so that they can be applied to several generations of products.

Another object of the present invention is to provide a low-cost and high speed process for fabrication and assembly.

Another object of the invention is to use only designs and processes already employed in the fabrication of integrated circuit devices, thus avoiding the cost of new capital investment and using the installed fabrication equipment base.

These objects have been achieved by the teachings of design concepts and process flow suitable for mass production. Various modifications have been successfully employed to satisfy product geometry's and material selections.

In one embodiment of the invention, a reinforcing patterned system for a bond pad is disposed in at least one dielectric layer or at least one dielectric stack of multiple dielectric layers disposed under the bond pad. A reinforcing patterned structure is disposed in at least one dielectric stack.

In another embodiment of the invention the reinforcing patterned structure may be a joined or interconnected structure. In another embodiment of the invention, the reinforcing patterned structure may comprise disjoined or non-interconnected and repeating elements.

In yet another aspect of the invention, a method for reinforcing a bond pad in a semiconductor integrated circuit includes the steps of forming a first dielectric layer, patterning the dielectric layer in a predetermined area into a predetermined pattern having a plurality of vacant areas, forming a metal layer above the patterned first dielectric layer, filling the vacant areas in the dielectric layer, removing the metal except for the filled vacant areas, whereby a uniformly flat surface is formed, and forming a second dielectric layer above the uniformly flat surface. A bond pad is then formed on the second dielectric layer.

A technical advantage of the present invention is the improved structural integrity of bond pads for the preferred damascene metallization process, with no unusual restrictions on design rules for dimensions of the reinforcing structure. Forces exerted during multiprobe testing and the bonding process do not damage the bond pad and underlying structures. These technical advantages are possible without changing probing or bonding parameters, which may otherwise decrease the process throughput and yield. The result is a more reliable device and diminished failure rates.

DETAILED DESCRIPTION OF THE PREFERRED EMBODIMENTS

Figure 1:
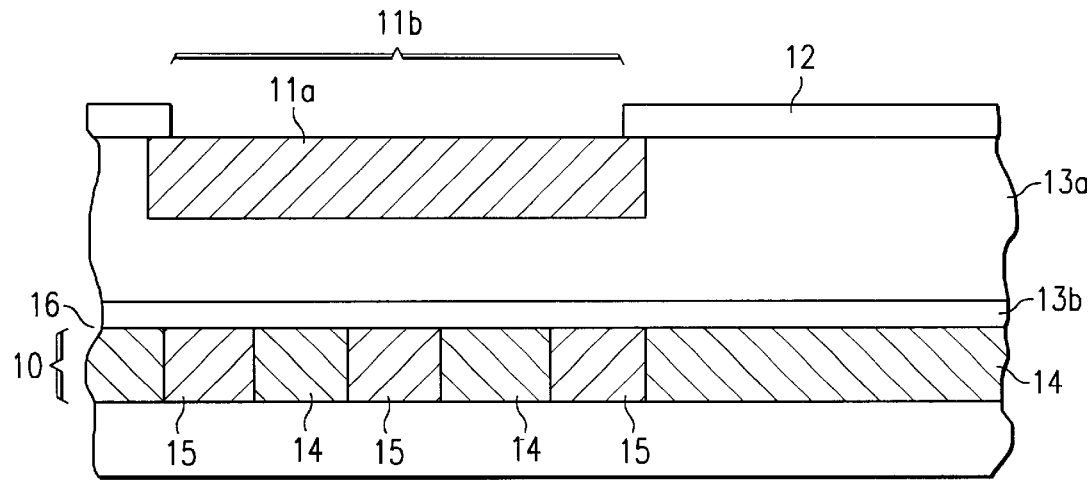
FIG. 1 is a schematic and simplified cross section of an embodiment of a damascene metallization bond pad with damascene metallization reinforcing structure according to the teachings of the present invention.
Figure 2:
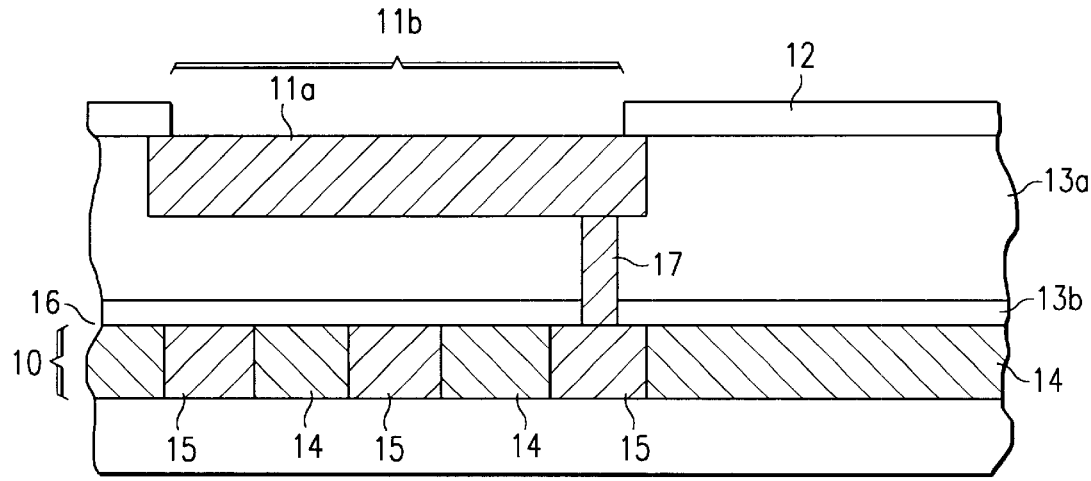
FIG. 2 is a schematic and simplified cross section of another embodiment of the present invention using damascene metallization for bond pad and reinforcing structure, with a metal-filled via connecting both metallization layers.

FIGS. 1 and 2 illustrate schematically two preferred embodiments of the present invention. According to the teachings of the invention, a reinforcing structure 10 is shown under bond pad metal 11a. Typically, the bond pad comprises aluminum or copper about 500 to 1000 nm thick, often with a thin (about 100 to 500 nm) underlayer (made of titanium, titanium nitride, or titanium-tungsten, tantalum, tantalum nitride, tantalum silicon nitride, tungsten nitride, or tungsten silicon nitride). The bond pad metal 11a is first covered with a moisture-impenetrable protective overcoat 12, usually silicon nitride (commonly 500 to 1000 nm thick), and then opened in its center portion 11b. This center portion will receive the ball or wedge of the bonding wire (not shown), mostly gold, copper or aluminum. If a ball of solder (some mixture of lead and tin, not shown) is to be affixed to 11b, it has to receive first an undermetal (not shown) of a thin film of a refractory metal and a thin film of a noble metal.

The present invention provides system and method of fabrication for the bond pads as well as for a reinforcing structure under the bond pads, when the so-called "damascene" process is used for producing the interconnecting metal lines of the integrated circuit. In the damascene process, the dielectric layer is deposited first; commonly used techniques include chemical vapor deposition, sputtering, or spin-on processes. Preferred materials include silicon dioxide, silicon nitride, oxy-nitride, fluorosilicate glass (FSG), undoped silicate glass (USG), phosphor-silicate glass (PSG), plasma-generated tetraethylorthosilicate oxide (TEOS), and recently silicon-containing hydrogen silsesquioxane (HSQ), or even gels or a foamy substance, or an organic polymeric such as polyimide. Each material has its preferred regime for application; for instance, silicon nitride stops penetration by water molecules, phosphorus-doped glass offers lower reflow temperatures, HSQ exhibits very low dielectric constant. Often, however, the desirable characteristics are accompanied by undesirable ones; so are HSQ and gels structurally and mechanically weak, and polymerics may require polymerization at elevated temperatures and may be thermally unstable. The thickness of the layers can be varied widely (from 20 to 1000 nm), but is typically quite uniform across a wafer diameter.

Openings or trenches are then etched into this layer; commonly used techniques include sputter etching, rarely chemical etching. Since masks are typically used for this process, the widths of the openings so created lead the trend in the semiconductor industry towards fine feature sizes and fine line pitch. The widths of the openings ranges from approximately 100 to more than 600 nm for lines, and 40 to 150 $\mu$m for bond pads.

Next, a suitable conductor, semiconductor, or metal such as aluminum (often doped with up to 2% copper and 1% silicon) or copper is deposited (usually by sputtering or by electroplating over a sputtered seed layer) over the whole surface, filling the openings uniformly and forming some blanket over the remainder of the surface. This blanket is then carefully removed by grinding and polishing, generating a uniformly flat surface of alternating dielectric and metallic portions. This uniformly flat surface is a main characteristic of a surface generated by the damascene process. The boundaries between the dielectric and the metallic portions are clearly defined, free of spurious material of either kind infringing onto the nearest neighbor portions. The resulting clearly defined pattern of dielectric and metal portions, or structures, is another characteristic of a surface generated by the damascene process. Other examples of conductive materials include a bottom layer made of a stack of titanium nitride/titanium/titanium nitride, followed by a middle layer of aluminum or copper, and topped by a titanium nitride layer.

These characteristic damascene features contrast sharply from the features of a surface created by the conventional technology. There, the metal layer is deposited first; openings are then etched into the metal layer and filled with dielectric material. When the dielectric material is semiviscous and allows a spin-on technique for filling the openings, the size of the opening has to be large enough to ensure proper filling by the semiviscous dielectric material, and in the process of filling, the semiviscous material forms a meniscus at the walls of the opening. Further, a thin film of the dielectric is deposited on the remainder of the metal surface between the openings. Consequently, the resulting surface is not uniformly flat, and spurious dielectric remains on the metal surface outside the openings.

Figure 7:
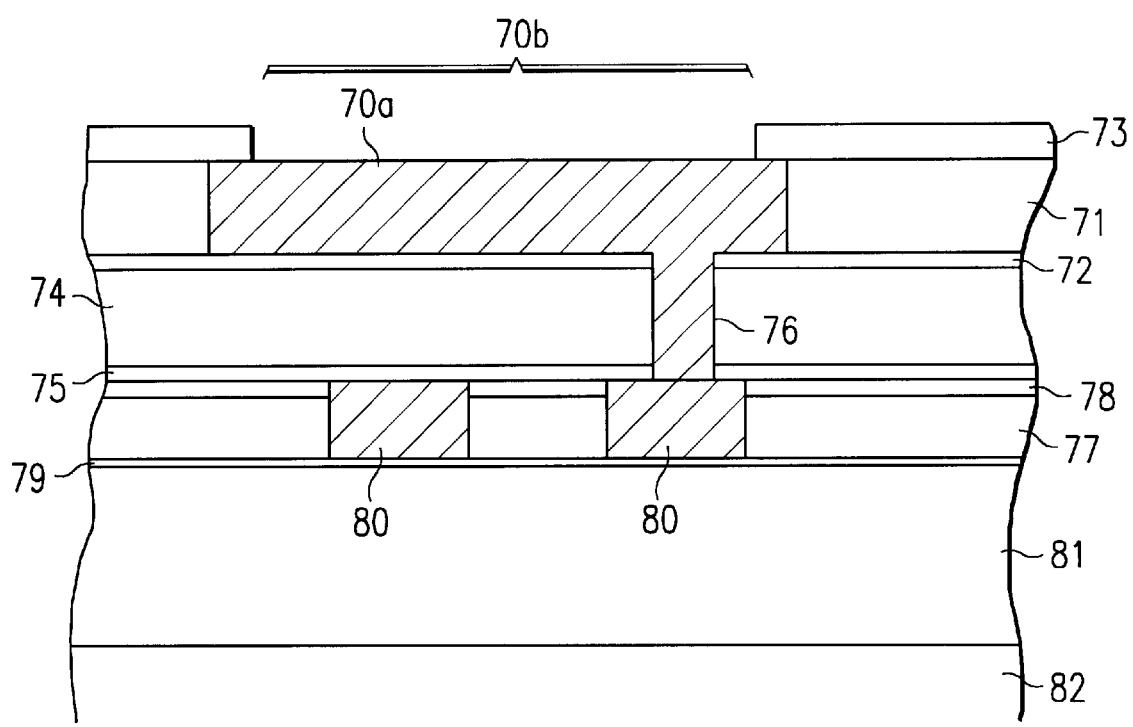
FIG. 7 is a schematic cross section of another embodiment of a damascene metallization bond pad with damascene metallization reinforcing structure according to the teachings of the present invention, with a trench and polysilicon structure underneath.

The dielectric layer into which bond pad 11a is fabricated, has the reference numerals 13a and 13b in FIGS. 1 and 2. Layer 13a is typically made of TEOS oxide, silane oxide, FSG, polyimide, or other dielectric with low dielectric constant. Optional layer 13b is made of silicon nitride, silicon oxynitride, or silicon carbide. As is shown in FIG. 7, each of these layers may be constructed of dielectric stacks; at least one layer within each dielectric stack comprises a structurally and mechanically weak dielectric material.

The reinforcing structure 10 in FIGS. 1 and 2 comprises a structurally and mechanically weak dielectric layer 14, made for instance of low constant dielectric HSQ. Using the damascene technology, a pattern 15 of metal is created which is mechanically stronger than dielectric material 14 and thus reinforces the weak dielectric layer 14. Because of the damascene process, the patterns of alternating metal and dielectric structures (14 and 15) must have the same layer thickness and remain discretely confined to their respective materials and form a uniformly flat interface to the dielectric layers 13b and 13a.

It should be pointed out that dielectric layers 14 and 13a may be made of different dielectric materials, or may be made of the same dielectric material.

Figure 3:
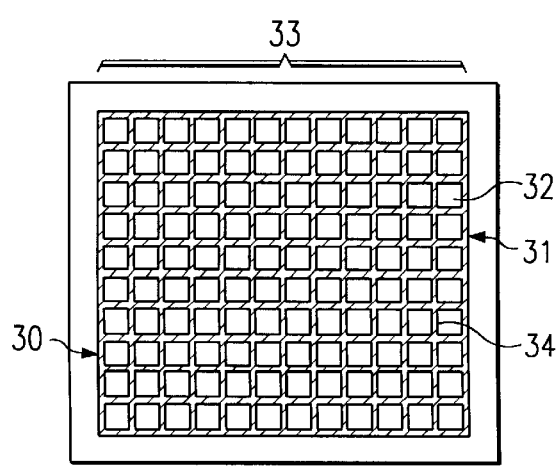
FIGS. 3 to 6 are schematic top views of varying embodiments of the bond pad reinforcing structure, made by damascene metallization according to the teachings of the present invention.

The reinforcing system occupies a substantial area under bond pad 13a in FIGS. 1 and 2. In actual device designs, the reinforcing structures may take a variety of different configurations. Examples are given in FIGS. 3, 4, 5, and 6. FIG. 3 illustrates a grid pattern 30 with a regular repeating metal structure 31 and a plurality of areas 32 filled with the dielectric material of layer 14 in FIGS. 1 and 2. The reinforcing characteristic of pattern 30 results from optimizing the grid pattern with its metal-to-dielectric ratio using stress modeling based on finite element analysis. In contrast to designing a reinforcing grid pattern as shown in FIG. 3 based on conventional metallization technique with its requirement to supply wide enough reservoirs for successful filling with spin-on dielectric materials, the damascene metallization technique offers the advantage of structuring a reinforcing grid pattern with dimensions as small as proscribed by the circuit design rules. This permits the design of grid with fine mesh, thus extra strong reinforcing capability. Another advantage of the damascene technique for executing a grid design like in FIG. 3 is the fact that nowhere is any thin film of weak dielectric left atop of the reinforcing structure. On the contrary, the patterns of both the dielectric and the metallic materials remain discretely confined to their respective materials.

The reinforcing structure of FIG. 3 is a joined or interconnected grid structure 31 with a plurality of areas 32 for containing and accommodating a large portion of weak dielectric material (14 in FIG. 2) herein. Accordingly, reinforcing structure 30 provides support and mechanical strength to dielectric stack 13a and 13b in FIG. 2 so that incidents of cratering and other bonding-related failures caused by wire bonding are substantially suppressed.

By way of example, grid structure 31 may be made of copper. The walls of grid 31 are 0.5 $\mu$m thick. The grid may occupy a square-shaped area with side length 33 of 80 $\mu$m. If the dielectric material filling areas 32 is a stack of mostly HSQ with a thinner overlayer of oxide (see layers 77 and 78 in FIG. 7), each area 32 is square shaped with side length 34 of 2.0 $\mu$m.

Figure 4:
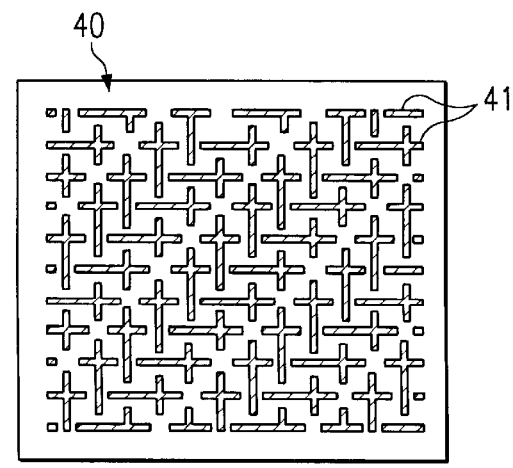

Similar success can be obtained by a repeating yet noninterconnected pattern 40 as shown in FIG. 4. A crucifix-shaped pattern 41 is shown arranged in a regular manner. It is contemplated by the teachings of the present invention that reinforcing structures such as illustrated in FIGS. 3 and 4 may be applied in more than one intermetal dielectric layer or stacks under the bond pad. In this case of repeated application, crucifix-shaped reinforcing structures as shown in FIG. 4 may be slightly offset from one another without diminishing their reinforcing capability.

Reinforcing structures such as 30 and 40 are preferably dimensioned to fit generally within and not significantly extending beyond an area defined by bond pad 11a, as can be seen schematically in FIGS. 1 and 2. When more than one reinforcing layer is used, reinforcing structures such as 30 and 40 for each intermetal dielectric layer or stack may be aligned directly above one another, or be slightly offset with one another. It is contemplated by the teachings of the present invention that any number, including one, of reinforcing structures or layers may be used to achieve improved structural integrity and robustness. For devices with multiple dielectric layers or stacks, the present invention also teaches that these intermetal dielectric layers or stacks may include reinforcing structures of different patterns, although such designs may require additional expense to use different masks to pattern etch the different metal reinforcing structures.

One embodiment of the concept just formulated comprises a first reinforcing pattern, such as a plurality of metal lines oriented parallel to each other, embedded in one dielectric layer or stack, while a second reinforcing pattern, for instance another plurality of parallel metal lines, is embedded in another dielectric layer or stack yet oriented at an angle with respect to the first pattern. Preferably, the sets of reinforcing lines in the two dielectric layers may be oriented perpendicularly with respect to each other. It is, however, contemplated by the teachings of the present invention to provide for reinforcing lines oriented in a manner other than 90° in alternating layers.

Figure 5:
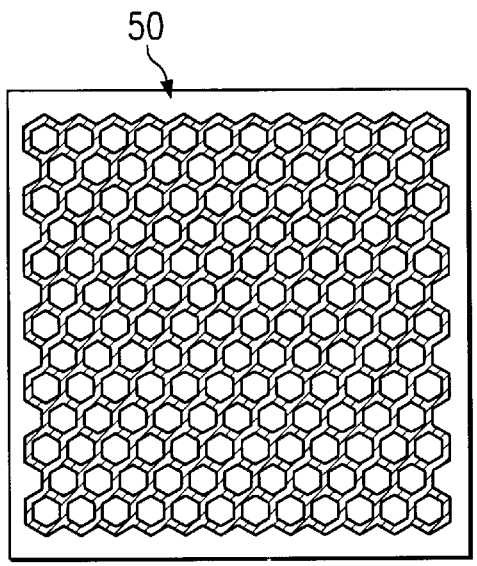

The reinforcing structure 50 in FIG. 5 is an embodiment having a repeating connected honeycomb pattern. As nature has demonstrated in numerous examples from the atomic structure of crystals to the storage cells of beehives, the honeycomb structure has superior structural integrity and strength and is, therefore, perfectly suited to fortify the weak dielectric layers in semiconductor devices. In another embodiment, crosswise reinforcing metal lines may be added.

Figure 6:
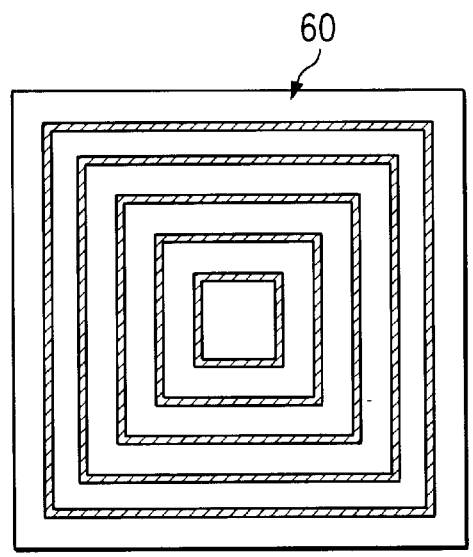

An alternate embodiment of the present invention is shown in FIG. 6. Reinforcing structure pattern 60 includes reinforcing lines forming a plurality of interconnected or unconnected nested squares or rectangles underlying the bond pad. In variation to this concept of nested patterns underlying the bond pad, the teachings of the present invention contemplate other embodiments such as nested circles, ellipses, spirals or other structures, with or without interconnection, with or without crosswise reinforcements.

FIG. 2 shows a further variation of an embodiment of the present invention. A metal-filled via 17 connects the periphery of the bond pad 11a to at least part of the reinforcing metal structure 15. Via 17 traverses dielectric layer 13a and via stop 13b and thus contributes to reinforcing those dielectric layers. Via 17 especially allows to apply the same electrical potential reinforcing structure 15 which is applied to bond pad 11a. Via 17 is made of tungsten or the same metal as the bond pad.

A via, connecting bond pad metal and reinforcing metal, traversing dielectric stacks is shown in FIG. 7 in simplified and schematic manner for damascene metallization technique. The bond pad 70a (made of aluminum or copper) is fabricated into dielectric layer 71 (made of, as example, FSG, USG, PSG oxides, or polymeric) which has an underlayer 72 of silicon nitride. After the damascene polishing of the bond pad metallization, protective overcoat 73 (silicon nitride) is deposited and patterned to open window 70b for exposing the bond pad metal for bonding. Under the bond pad is another dielectric layer 74 (made of, as example, FSG, USG, PSG oxides, or polymeric) with yet another silicon nitride or oxy nitride layer 75 as via stop. The dielectric layer 74 and both nitride layers 72 and 75 are traversed by via 76, made of tungsten or the same metal as the bond pad. Via 76 is preferably located at the periphery of bond pad 70a.

The dielectric layer to be strengthened by the reinforcing structure is the weak dielectric layer 77 (made of HSQ or the same material as dielectric layer 74 or 71); it is often topped by dielectric layer 78, made of FSG, USG, PSG oxides, or polymeric, and has an underlayer 79 made of silicon nitride as trench stop. Into weak dielectric layers 77 and 78, the reinforcing metallization 80 is fabricated in one of the patterns described above, using the damascene technique. Through via 76, the reinforcing structure may obtain the same electrical potential as is applied to bond pad 70a. Layer 81 is a pre-metal dielectric, typically USG or PSG oxide. This sequence of weak dielectric layer with embedded reinforcing structure may then be repeated several more times. Finally, the silicon substrate is indicated by reference numeral 82.

As can be seen from the above examples, the reinforcing structures made by damascene metallization technology may take on a wide variety of patterns. In general, the patterns may be regular and repeating, such as the grid, crucifix, honeycomb, and nested configurations. The pattern may also have connected or unconnected reinforcing elements. However, non-repeating patterns may also be used provided that the ratio of weak dielectric versus strong reinforcing structures produces the intended overall strengthening result. The reinforcing structure pattern preferably occupies the entire or a substantial area under the bond pad and allows the weak dielectric material to be intersected by the reinforcing lines of the reinforcing structure. The composition of the reinforcing structure may be the same as the metallization employed in the corresponding metal layers of the integrated circuit, but the reinforcing structure may also be constructed of other conductive or semiconductive materials.

It may be understood that the reinforcing structure of the present invention is applicable to strengthen a damascene bond pad with underlying weak dielectric layers so that it may withstand stresses and forces imparted during multi-probe testing, any wire, solder, or other bonding processes, such as ball bonding, wedge bonding, ultrasonic bonding, thermosonic bonding, thermocompression bonding, solder bump attachment and flip-chip bonding.

Accordingly, the teachings of the present invention include any structure constructed by damascene metallization technology, especially with fine feature sizes and pitch, and located substantially within the bond pad area that mechanically reinforces the underlying brittle and/or soft dielectric layers. It is particularly advantageous when the damascene reinforcing structure is produced in conjunction with a damascene metallization process already being executed for interconnecting metal lines in the integrated circuit.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A reinforcing system for a semiconductor integrated circuit having a damnascene metallization and copper bond pads consisting essentially of: a first dielectric layer disposed under said bonds pads; at least one second dielectric layer selected from HSQ, polymides, aerogels and parylenes disposed under said first dielectric layer; and a reinforcing structure disposed into said second dielectric layer such that the patterns of said second dielectric layer comprise a uniformly flat interface with said first dielectric layer.

2. The reinforcing system according to claim 1 wherein said patterns of said reinforcing structure and said second dielectric layer comprise dimensions and pitches used in said integrated circuit.

3. The reinforcing system according to claim 2 wherein said pattern dimensions of said reinforcing structure are selected relative to the material of said second dielectric layer such that said reinforcement is accomplished.

4. The reinforcing system according to claim 1 wherein said second dielectric layer includes areas filled by said reinforcing structure.

5. The reinforcing system according to claim 1 wherein said reinforcing structure occupies a substantial area under the bond pads.

6. The reinforcing system according to claim 1 wherein said reinforcing structure is mechanically stronger than said second dielectric layer.

7. The reinforcing system according to claim 1 wherein said second and said first dielectric layers are made of different dielectric materials.

8. The reinforcing system according to claim 1 wherein said second and said first dielectric layers are made of the same material.

9. The reinforcing system according to claim 1 wherein said first and second dielectric layers include an organic dielectric layer.

10. The reinforcing system according to claim 1 wherein said reinforcing structure is constructed of interconnecting of metal lines.

11. The reinforcing system according to claim 1 wherein said reinforcing structure includes alternating layers having parallel lines in one layer oriented generally perpendicularly with parallel lines in another layer.

12. The reinforcing system according to claim 1 wherein said reinforcing structure includes a plurality of connected structural elements.

13. The reinforcing system according to claim 1 wherein said reinforcing structure includes a plurality of repeating structural elements.

14. The reinforcing system according to claim 1 wherein said reinforcing structure includes a plurality of repeating non-interconnected structural elements.

15. The reinforcing system according to claim 1 wherein said reinforcing structure includes a grid pattern.

16. The reinforcing system according to claim 1 wherein said reinforcing structure includes a repeating crucifix pattern.

17. The reinforcing system according to claim 1 wherein said reinforcing structure includes a honeycomb pattern.

18. The reinforcing system according to claim 1 wherein said structure is connected to said bond pads by at least one via.

19. A reinforcing system for a semiconductor integrated circuit having damascene metallization and copper bond pads comprising:
- a first dielectric stack disposed under said bond pads; a second dielectric stack selected from HSQ, polymides, aerogels, and parylenes disposed under said first dielectric stack; and
- a reinforcing metal structure into said second dielectric stack such that the patterns of said reinforcing metal structure and said second dielectric stack comprise a uniformly flat interface towards said first dielectric stack.

20. The reinforcing system according to claim 19 wherein said first and second dielectric stacks comprise multiple dielectric layers and said reinforcing metal structure is disposed in at least one dielectric layer of said second dielectric stack.

21. The reinforcing system according to claim 19 wherein said patterns of said reinforcing structure and said second dielectric stack comprise feature sizes used in said integrated circuit.

22. The reinforcing system according to claim 19 wherein said reinforcing structure includes alternating layers having parallel lines in one layer oriented generally perpendicular with parallel lines in another layer.

23. The reinforcing system according to claim 19 wherein said reinforcing structure includes a plurality of repeating connected structural elements.

24. The reinforcing system according to claim 19 wherein said reinforcing structure includes a plurality of repeating non-interconnected structural elements.

25. The reinforcing system according to claim 19 wherein said reinforcing structure includes a plurality of nested patterns.

26. The reinforcing system according to claim 19 wherein said reinforcing structure includes a spiral pattern.

27. A reinforcing system for a semiconductor integrated circuit having damascene metallization and copper bond pads comprising:
- a first dielectric layer disposed under said bond pads;
- at least one second dielectric layer selected from HSQ, polyimides, aerogels and
- disposed under said first dielectric layer; and a reinforcing structure
- disposed into said second dielectric layer such that the areas of said reinforcing structure are free of spurious material of said second dielectric layer, whereby the patterns of said reinforcing structure and said second dielectric layer remain discretely confined to their respective materials.

* * * * *